United States Patent [19]

Sparks et al.

[11] Patent Number: 4,752,871
[45] Date of Patent: Jun. 21, 1988

[54] SINGLE-CHIP MICROCOMPUTER HAVING A PROGRAM REGISTER FOR CONTROLLING TWO EEPROM ARRAYS

[75] Inventors: Robert W. Sparks; Phillip S. Smith; Brian F. Wilkie; Paul D. Shannon, all of Austin, Tex.

[73] Assignee: Motorola, Inc., Schaumburg, Ill.

[21] Appl. No.: 781,368

[22] Filed: Sep. 30, 1985

[51] Int. Cl.⁴ .................................................. G06F 12/02
[52] U.S. Cl. ................................... 364/200; 365/185; 365/218
[58] Field of Search ... 364/200 MS File, 900 MS File; 365/220, 235, 244, 218, 185

[56] References Cited

U.S. PATENT DOCUMENTS

| 4,153,933 | 5/1979 | Blume, Jr. | 364/200 |
| 4,382,279 | 5/1983 | Ugon | 364/200 |
| 4,491,907 | 1/1985 | Koeppen et al. | 364/200 |
| 4,498,151 | 2/1985 | Henry | 364/900 |
| 4,519,028 | 5/1985 | Olsen | 364/200 |
| 4,698,750 | 10/1987 | Wilkie et al. | 364/200 |

OTHER PUBLICATIONS

"Non-Volatile Semiconductor Storage for Printers" J. I. Compton IBM Technical Disclosure Bulletin vol. 24 No. 8 Jan. 1982 pp. 4361–4362.

*Primary Examiner*—Archie E. Williams, Jr.
*Assistant Examiner*—Emily Y. Chan
*Attorney, Agent, or Firm*—John A. Fisher; Jeffrey Van Myers; David L. Mossman

[57] ABSTRACT

A single-chip microcomputer comprises at least two separate and independent electrically erasable programmable read only memories (EEPROMs) on-board which may be independently programmed, erased and read. Each part of the split EEPROM has its own data bus and address bus. Programming and erasing is controlled by a program register which has separate bits for configuring and latching the data and address buses of a selected EEPROM array, for providing programming voltage to the array of choice and for choosing between programming and erasing the selected array. The split EEPROM provides versatility to the user in allowing one part of the EEPROM to be programmed while the program stored in another part of the EEPROM or RAM may be read and utilized. In addition, test time and effort of the microcomputer may be considerably reduced.

2 Claims, 3 Drawing Sheets

PROGRAM REGISTER

| 7 | 6 | 5 | 4 | 3 | 2 | 1 | 0 |
|---|---|---|---|---|---|---|---|
| 0 | CPEN | 0 | 0 | ERASE | LATA | LATB | EEPGM |
|   | 38 |   |   | 34 | 24 | 26 | 36 |

EEPROM ERASING

SINGLE-BYTE EEPROM PROGRAMMING

SINGLE-CHIP MICROCOMPUTER HAVING A PROGRAM REGISTER FOR CONTROLLING TWO EEPROM ARRAYS

FIELD OF THE INVENTION

The invention relates to microcomputers having read only memories (ROMs) and more particularly relates to microcomputers having on-board electrically erasable programmable ROMs (EEPROMs).

BACKGROUND OF THE INVENTION

During the evolution of single chip microcomputers, on-board memory configurations have included various mixtures of random access memory (RAM), mask programmed ROM and programmable ROM that is erasable by ultraviolet (UV) light (EPROM). Historically, electrically erasable programmable read only memory (EEPROM) has evolved more slowly than EPROM. Typically, more silicon space is required to implement EEPROM than EPROM. Endurance, or the ability to withstand many programming cycles, is less with EEPROM than with EPROM. Complementary metal-oxide-silicon (CMOS) technology EEPROM is also prone to latchup problems under high voltage programming stress.

In recent years, however, advances have been made in EEPROM technology, and the gap between it and EPROMs has been closing. As production of 64 kbit EEPROMs grows and 256 kbit EEPROMs become economically feasible, EEPROMs are finding their way into a significant number of applications. Most of these applications utilize the advantages EEPROMs offer over EPROMs which include reduced package costs since no UV window is required to perform a bulk erase. EEPROM provides non-volatile, yet alterable, storage for computer systems. Since it is erasable in-circuit, software updates performed in the field may require nothing more than the user connecting a system to a modem. No disassembly and swapping of EPROMs or ROMs is necessary.

Until now, only small amounts of EEPROM have found their way onto single chip microprocessors. On-board EEPROM opens new doors for single chip microcomputers by providing a relatively large amount of non-volatile, yet alterable storage. However, it must be realized that for any EEPROM array, the address and data buses must be configured and latched for a period of time during programming, and thus execution from that part of the memory is inhibited. Thus, as more and more EEPROM is placed onboard with the microcomputer, and as the EEPROM is used more and more by the user, the central processing unit (CPU) must wait more often to execute from part of the EEPROM if another portion of the EEPROM is still undergoing a programming operation. In addition, as the EEPROMs on chips become larger the time required to test them becomes proportionally larger as well.

SUMMARY OF THE INVENTION

Accordingly, it is an object of the present invention to provide a single chip microcomputer having on-board EEPROM which will allow execution from one portion of the EEPROM array while a programming operation is in progress on another part of the array.

Another object of the invention is to provide a single chip microcomputer with EEPROM which will permit more rapid programming and erasing of the EEPROM array.

Still another object of the present invention is to provide a single chip microcomputer with onboard EEPROM which has the time for testing the EEPROM appreciably reduced.

In carrying out these and other objects of the invention, there is provided, in one form, a single chip microcomputer having at least two independently programmable and erasable electrically erasable programmable read only memory (EEPROM) arrays; a program register for controlling the independent programming and erasing operations of each of the EEPROM arrays; and a central processing unit for cooperating with the program register to selectively program and erase the EEPROM arrays.

DETAILED DESCRIPTION OF THE INVENTION

It has been discovered that if a large EEPROM array is used on a single chip microcomputer that it is advantageous from a number of standpoints to physically split the array into two or more arrays. Each array has its own programming control consisting of address and data buses and erase control, which are logically isolated and controlled with separate control bits. As before, to program an EEPROM cell, the address and data buses must be configured and latched for a period of time. In this invention, the smaller, subdivided arrays may be programmed independently and in parallel, if so desired. In other words, the invention allows code executing in one array to control the programming of the other array. When utilized in a manner requiring periodic data storage in non-volatile memory, execution of user code would not normally be possible from the EEPROM when programming is occurring. However, because of the multiple array implementation of the EEPROM of this invention, user code may execute from one array while controlling the storage of data values in the other array.

By splitting the array into two or more sections, the user can execute his application program from one array while programming one of the others. Currently, execution can only be done in ROM or RAM while programming EEPROM. Additionally, it should be remembered that EEPROM cells take several milliseconds to program or erase and if this is extrapolated into a very large array, the test time and test cost go up dramatically. By splitting the array into two or more sections, the test time may be reduced proportionally.

The invention will be described in the form to be implemented on the Motorola MC68HC805C4 single chip microcomputer, although other implementations would be considered within the scope of the invention. The overall single chip microcomputer is designated 10 in FIG. 1 which shows the detail of the features of this invention. In this embodiment, the EEPROM array is divided into two separate arrays, EEPROM array A 12 and EEPROM array B 14, although certainly the EEPROM array as a whole could be divided into any number of subarrays as needed. In the MC68HC805C4, array A 12 is in the lower addresses of the memory map and array B 14 is in the upper addresses, although this arrangement is somewhat arbitrary. In practice, the actual dividing address will be determined at the time of circuit design and/or layout.

Figures 1, 2:
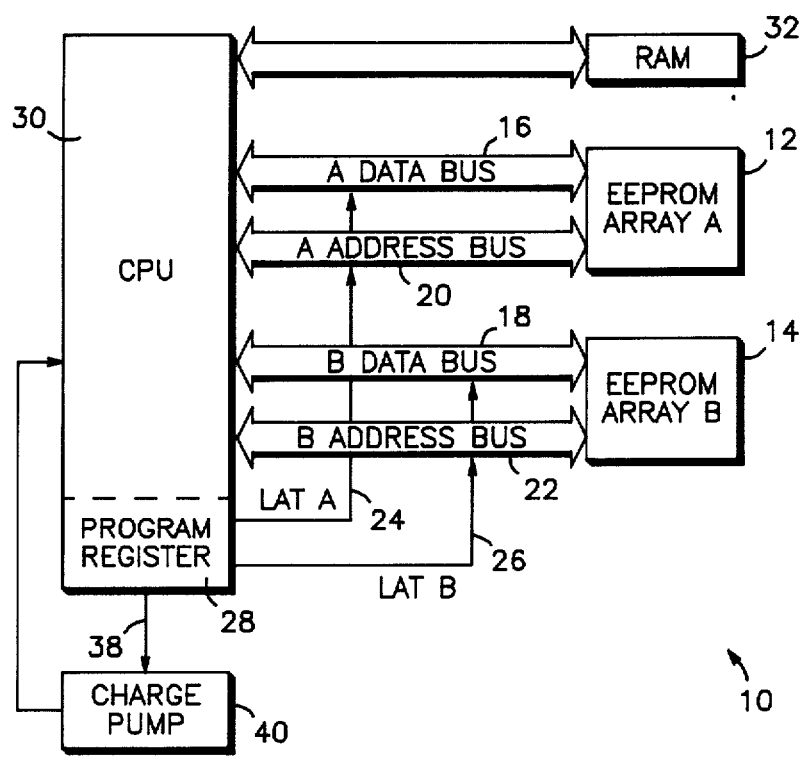
FIG. 1 is a schematic, block diagram of the split EEPROM array of this invention showing how it is controlled by the program register in the CPU.
FIG. 2 is a schematic representation of the program register used in this invention to control the split EEPROM array.

Programming the EEPROM can be done via the programming data buses: A data bus 16 and B data bus 18, and the address buses: A address bus 20 and B address bus 22 dedicated to EEPROM array A 12 and EEPROM array B 14, respectively. The programming data buses and their corresponding address buses are latched via the latch lines (LAT) 24 and 26 while a programming function is being done on that array. Programming the EEPROM arrays can be done by the user on a single-byte basis by manipulating the program (PROG) register 28 in central processing unit (CPU) 30. As shown in FIG. 1, the CPU 30 may read and write from random access memory (RAM) 32.

The particular PROG register 28 used in the MC68HC805C4 is shown in detail in FIG. 2. Of course, other register configurations and storage devices could be used as a program register 28. Two bits are associated with the area of EEPROM being modified: LATA 24 (bit 2) and LATB 26 (bit 1). As expected, LATA 24 controls the A array of EEPROM 12, while LATB 26 controls the B array of EEPROM 14. Programming is done on a byte by byte basis. For instance, when LATA 24 is set, writes to the EEPROM array A 12 cause the A data bus 16 and the entire 13 bit A address bus 20 to be latched. When LATB 26 is set, writes to EEPROM array B 14 cause the address and data buses 18 and 22 in that array to be latched. These LAT bits are readable and writable, but reads from either array are inhibited if the corresponding LAT bit is set. When the bit is clear, address and data buses are configured for normal operation. Reset clears these bits.

ERASE 34 (bit 3), when set indicates that an erase cycle is desired. This bit is readable and writable and is cleared by reset. Erasing is performed on all bytes within a single array, or on all arrays at once, as in a bulk erase. Array erasing is also controlled by LATA 24 and LATB 26.

EEPGM 36 (bit 0) controls the gating of the programming voltage to the various sections of EEPROM. When set, a programming or erase operation is enabled. This will enable programming voltage ($V_{pp}$) pulsing to be controlled internally and it will also allow the programming voltage to be present on the $V_{pp}$ pin even during normal operation. This bit can be read at any time, but can only be written to if one or both of the LAT bits are equal to one. If a LAT bit is not set, then EEPGM 36 cannot be set. Reset clears this bit.

A charge pump enable bit 38 (CPEN, bit 6) enables the on-board charge pump 40 for programming or erase operations. It is not necessary to have an on-board charge pump 40 provide $V_{pp}$. This voltage may optionally come from a separate pin off-chip from an external supply, although an on-board charge pump 40 is preferred. Other bits of PROG register 28 could be used in conjunction with the internal pump 40 to specify three or five volt operation.

Figure 4:
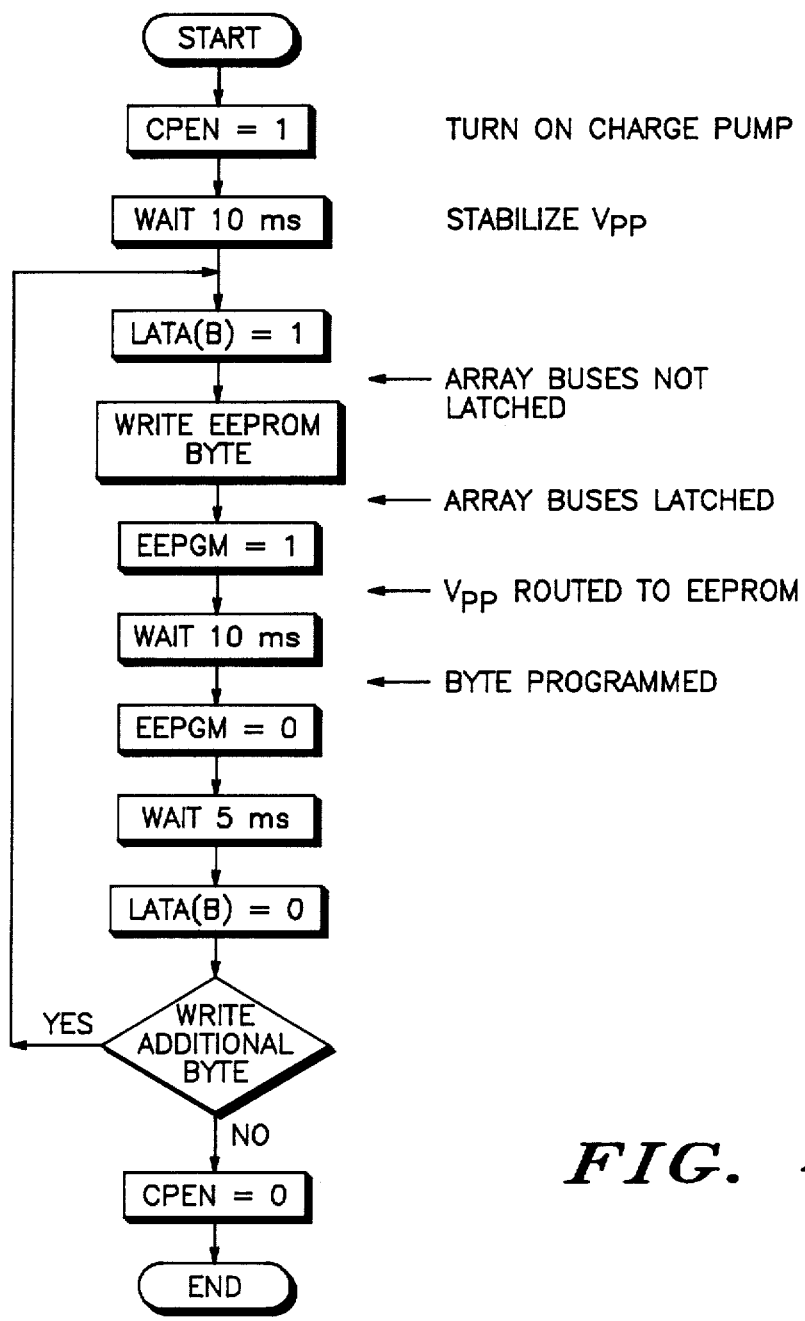
FIG. 4 is a representation of the split EEPROM array programming flowchart.

As shown in the flowchart of FIG. 4, programming the split EEPROM is accomplished by first enabling the charge pump 40 via CPEN 38, waiting approximately 10 msec for it to stabilize and then setting the appropriate LAT bit. The wait times mentioned in this description and in the drawings are for purposes of illustration only and are not intended to limit the scope of the invention. In this description, EEPROM array A 12 will be used; the procedures are identical for EEPROM array B 14. After setting the LATA bit 24, the desired value is written to the address to be programmed. The A address bus 20 and the A data bus 16 are automatically latched and held on the array. The EEPGM bit 36 is then set, gating the programming voltage generated by the charge pump 40 to the array A 12. After approximately 10 msec, EEPGM bit 36 is then cleared. Before clearing the LATA bit 24, a 5 msec delay is necessary to prevent inadvertent "phantom" programming of another EEPROM location. This cycle, except for one step, is repeated for the next byte to be programmed. The charge pump 40 may stay enabled, eliminating the 10 msec stabilization wait.

Figure 3:
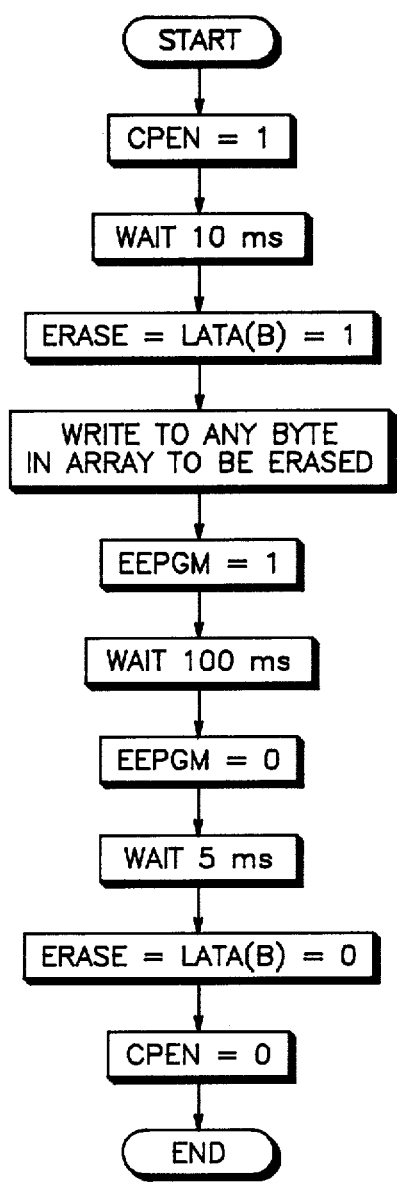
FIG. 3 is a representation of the split EEPROM array erasing flowchart.

As seen in the flowchart of FIG. 3, erasing is accomplished in a similar manner. After the charge pump 40 is enabled and stabilized, ERASE bit 34 and the appropriate LAT bit are set. Of course, the LAT bits determine whether array A 12, array B 14 or both arrays are to be erased. Again, LATA 24 will be used in this example. A dummy write is performed to any location within the EEPROM array and EEPGM bit 36 is set. Erasing an array of EEPROM takes approximately 100 msec. After the erase cycle delay, EEPGM bit 36 is cleared. A 5 msec delay is necessary before clearing ERASE bit 34 and LATA bit 24.

To demonstrate the complete technique, suppose the user wishes to first erase the A array 12, then program a value into one location within that array 12. First, CPEN 38 would be set to a one. After a 10 msec delay to allow the charge pump 40 to stabilize, he would then set ERASE bit 34 and LATA bit 24 to a one, and make sure that LATB bit 26 is a zero. Any data value would be written to any location in EEPROM array A 12, then EEPGM bit 36 would be set. After 100 milliseconds, EEPGM 36 is cleared. After 5 msec, LATA 24 and ERASE 34 are cleared. To begin the program cycle, LATA 24 is then set back to a one. The appropriate data is written to the appropriate address in the A array 12, and EEPGM 36 is set. After a wait of 10 msec, EEPGM is cleared. Five msec later, LATA 24 is cleared and the charge pump 40 may be shut off if no further programming is desired. The desired byte of EEPROM should then be programmed. Programming the split EEPROM is thus simple and performed with completely self-contained hardware.

If both LATA 24 and LATB 26 are set then both arrays will be programmed simultaneously. User programs may be independent or may call subroutines from any bootstrap ROM on board, any RAM or any other memory available, but not from any array that is being programmed since that array will have its address and data buses latched.

This invention will be utilized by the end user in a single chip environment where one array may contain the bulk of his application software, and another array may be a data table or contain information that must be updated periodically or changed in the field and retained on power down. In this case, the main application software is still available for execution while the programming operation is in progress. It will also be used in a production test environment since it will reduce the overall test time required by bulk erasing and bulk loading the multiple arrays simultaneously. In other words, the independent data and address buses for each array allows testing of the arrays in parallel, effectively dividing the test time by the number of independent arrays.

We claim:

1. A single chip microcomputer comprising:
   at least two independently programmable and erasable electrically erasable programmable read only memory (EEPROM) arrays, each EEPROM array having its own data bus and address bus; and
   a central processing unit connected to each EEPROM array via their data and address buses containing
   a program register for controlling the programming and erasing operations of the EEPROM arrays, the program register comprising:
      a control bit for each EEPROM array for permitting the data bus and the adddress bus of the corresponding EEPROM array to be simultaneously latched during programming and erasing operations;
      a control bit for controlling the programming or erasing power to the EEPROM arrays; and
      a control bit having a set state and a clear state, which is determined by the central processing unit, where the set state enables one or more of the EEPROM arrays to be erased, and the clear state enables programming or reading of the EEPROM arrays.

2. The single chip microcomputer of claim 1 in which the single chip microcomputer surther comprises an internal charge pump for controlling and providing a programming voltage to the EEPROM arrays, the internal charge pump being connected to the central processing unit via a charge pump enable line, and the program register further comprises a control bit for enabling and disabling the internal charge pump via the enable line to control and provide the programming voltage.

* * * * *